US006767186B2

(12) United States Patent
Olesiewicz (10) Patent No.: US 6,767,186 B2
(45) Date of Patent: Jul. 27, 2004

(54) FAN WITH AUTOMATIC FAILURE MODE

(75) Inventor: Timothy W. Olesiewicz, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/284,786

(22) Filed: Oct. 31, 2002

(65) Prior Publication Data

US 2004/0086385 A1 May 6, 2004

(51) Int. Cl.[7] ............................................. F04D 29/34
(52) U.S. Cl. ...................... 416/136; 416/139; 416/206
(58) Field of Search ................................. 416/135, 139, 416/142, 205, 206, 136

(56) References Cited

U.S. PATENT DOCUMENTS 2,917,227 A * 12/1959 Ruegsegger ................. 416/52
3,580,694 A * 5/1971 Andersen et al. ........... 416/136
3,967,916 A * 7/1976 Chittom ...................... 416/167
6,386,826 B1 * 5/2002 Jacob ......................... 415/125

* cited by examiner

Primary Examiner—Ninh H. Nguyen
(74) Attorney, Agent, or Firm—Park, Vaughan & Fleming LLP (57) ABSTRACT

An airflow apparatus (e.g., a fan, a blower) is provided for impeding or facilitating airflow through a channel when the apparatus is inoperative. The apparatus comprises a set of blades or airfoils that, when operating, promote or force a flow of air through the channel. The apparatus includes a bias mechanism for biasing the blades of the apparatus toward failure positions blocking or opening the airflow when the apparatus is at rest or turned off. When the apparatus begins spinning, the bias mechanism is overcome and the blades take their normal operating positions. The bias mechanism may comprise a spring or elastic material that resists rotation, extension or other type of blade transition from the failure position to the operating position. Or, the bias mechanism may involve a blade design (e.g., edge weighting) that attempts to place a blade in its failure position.

49 Claims, 7 Drawing Sheets

FIG. 2A Normal Operating Position

FIG. 2B Failure Position - Open

FIG. 2C Failure Position - Closed

FAN WITH AUTOMATIC FAILURE MODE

BACKGROUND

This invention relates to the field of ventilation. More particularly, an airflow device, such as a fan, is provided with an automatic failure mode to place the device in a configuration to either impede or allow airflow.

Multiple fans or similar airflow-inducing devices (e.g., blowers) are often used together to increase the volume, rate or force of ventilation. For example, two or more small axial fans may be used in parallel or in series to generate airflow through a computer system or other piece of electronic equipment. In a parallel arrangement, the fans promote parallels flows of air through different apertures or openings in the equipment. In a series configuration, the fans are aligned in sequence from a single aperture.

When one fan in a multi-fan arrangement fails, its failure can significantly affect the operating efficiency of the other fan(s). In a parallel arrangement, when one fan fails, it may create a "short-circuit" that prevents air from flowing through much of the equipment. In a series configuration, the blades of the failed fan will impede the airflow generated by the remaining fan(s).

Attempts to alleviate the impact of a fan failure on a functioning fan have been ineffective or have caused other problems. For example, a baffle or flap may be added to a fan operating in a parallel configuration. The baffle is blown out of the way when the fan is operating, but is intended to block the fan if it fails. However, even if the baffle helps block the fan when it fails, while the fan is operating, some of the efficiency of the fan is wasted on keeping the baffle open. In addition, the baffle occupies space that may be put to better use.

In a series arrangement, a fan may be equipped with fewer blades so that it creates less impedance if it fails. However, the decreased number of blades affects the fan's efficiency when it is operating.

Therefore, there is a need for an airflow device (e.g., fan, blower) that can automatically fail into a mode or configuration that either blocks or opens an air channel through the fan, as desired.

SUMMARY

In one embodiment of the invention, an airflow apparatus (e.g., a fan, a blower) is provided for impeding or facilitating airflow through a channel when the apparatus fails or is inoperative. The apparatus comprises a set of blades or airfoils that, when operating, promote or force a flow of air through the channel. The apparatus also includes a bias mechanism for biasing the blades of the apparatus toward failure positions blocking or opening the channel when the apparatus is at rest or turned off. When the apparatus begins spinning, the bias mechanism is overcome and the blades take their normal operating positions. The apparatus may be employed by itself or as one of multiple apparatuses working together.

In different embodiments, the bias mechanism may comprise a spring or elastic material that resists rotation, extension or other type of blade transition from the failure position to the operating position or promotes rotation, contraction or other transition from the operating position to the failure position. In one implementation, the bias mechanism may involve a blade design (e.g., weighting) that attempts to place a blade in its failure position by the force of gravity. In these embodiments, and others, centrifugal force generated by the spinning blades places the blades into their normal operating positions. However, when that centrifugal force is terminated or sufficiently attenuated, the blades are returned to their failure positions.

DETAILED DESCRIPTION

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the scope of the present invention. Thus, the present invention is not intended to be limited to the embodiments shown, but is to be accorded the widest scope consistent with the principles and features disclosed herein.

In an embodiment of the invention, an apparatus is provided for generating or promoting flow of air (or other gas or liquid) when in an operating position, and either impeding or facilitating airflow in an automatic failure position. In different embodiments, the apparatus may comprise a fan, a blower or other device comprising airfoils (e.g., blades) that are configured to spin around a hub, spinner, axle or other component. When spinning, the airfoils impact the air at an angle to force the air to flow through a channel. The apparatus may be employed by itself or in combination with one or more additional apparatuses.

In one embodiment of the invention, when the apparatus fails or is turned off, the airfoils transition from their operating position to an open position in which they lie approximately parallel to the desired flow of air. Although the airfoils are not helping generate air flow, in this failure position the airfoils present little impedance to the flow of air through the channel. This embodiment may be particularly beneficial when one or more additional apparatuses are employed in series with the failed or inoperative one.

In another embodiment of the invention, when the apparatus fails or is turned off, the airfoils transition from their operating positions to a closed position in which they lie approximately perpendicular to the desired airflow. In this failure position, the airfoils present significant impedance to the flow of air through the channel. This embodiment may be beneficial when one or more additional apparatuses are employed in parallel with the failed or inoperative one.

Figure 1A:
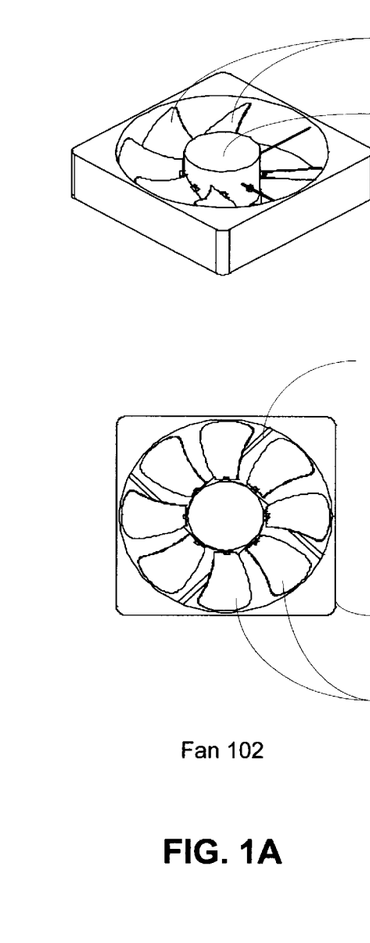
FIGS. 1A–C are block diagrams depicting a fan in operating and failure positions, in accordance with an embodiment of the present invention.
Figure 1B:
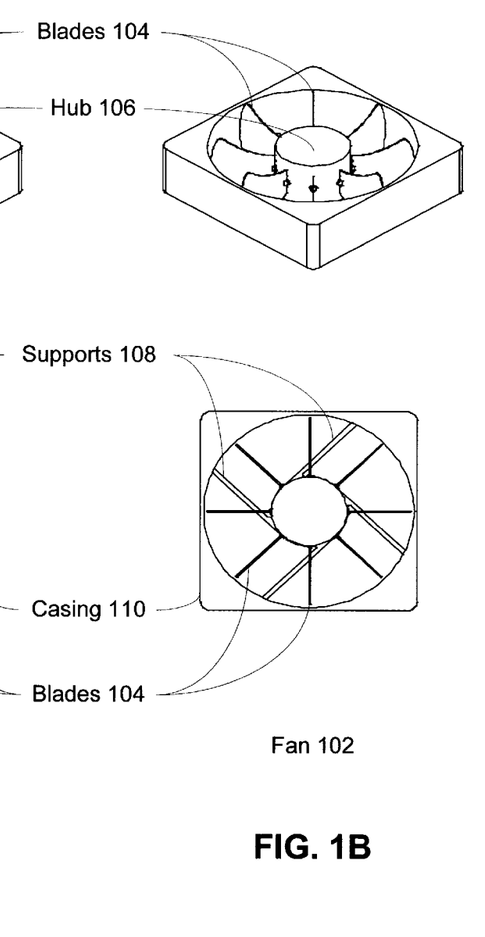
Figure 1C:
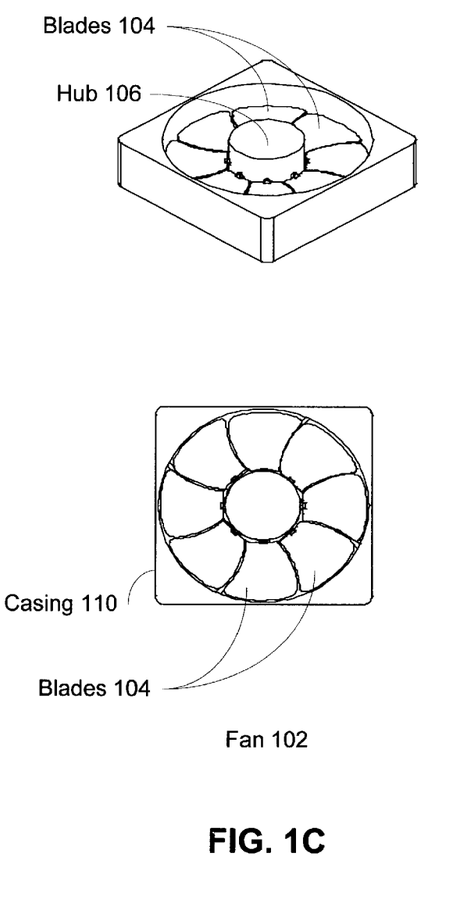

FIGS. 1A–C provide views of an airflow apparatus (e.g., a fan) demonstrating a normal operating position and alternative failure positions, according to one or more embodiments of the invention.

In these embodiments, fan 102 comprises a plurality of airfoils (i.e., blades 104) coupled to hub 106, which spins about an axle (not shown). Hub 106 may contain a motor for spinning the hub, or electronics or circuitry coupling the hub to a motor. Fan 102 also comprises supports 108 and casing 110. Casing 110 defines a channel for the flow of air through the apparatus, while supports 108 provide rigidity and may comprise circuits or power for operating the fan.

FIG. 1A demonstrates fan 102 in an operating position, according to one embodiment of the invention. In this position, the surfaces of blades 104 are oriented at some angle, between 0 and 90 degrees, to the desired flow of air. In this position, when hub 106 rotates and spins the blades, air is forced through the channel defined by casing 110.

FIG. 1B demonstrates fan 102 in an "open" failure position according to an embodiment of the invention. In this position, the surfaces of blades 104 are oriented substantially parallel to the desired air flow. Thus, when hub 106 is not spinning or is spinning very slowly, the blades present minimal impedance to any natural airflow through the channel or any airflow that may be due to the operation of other fans or devices.

FIG. 1C demonstrates fan 102 in a "closed" failure position according to one embodiment of the invention. In this position, the surfaces of blades 104 are oriented substantially perpendicular to the desired air flow. Thus, when hub 106 is not spinning or is spinning very slowly, the blades present significant impedance to any natural airflow through the channel or any airflow that may be due to the operation of other fans or devices.

Figure 2A:
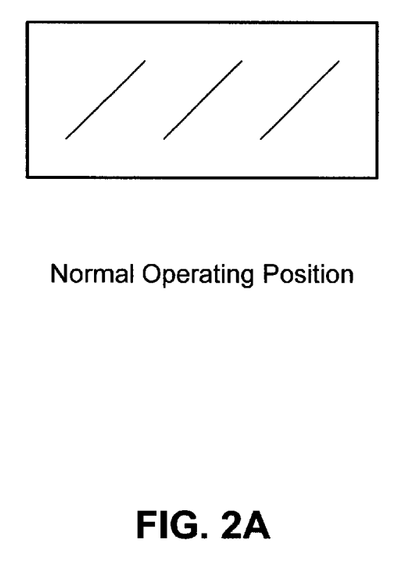
FIGS. 2A–C comprise side views of the fan depicted in FIG. 1, demonstrating the orientation of the fans' blades.
Figure 2B:
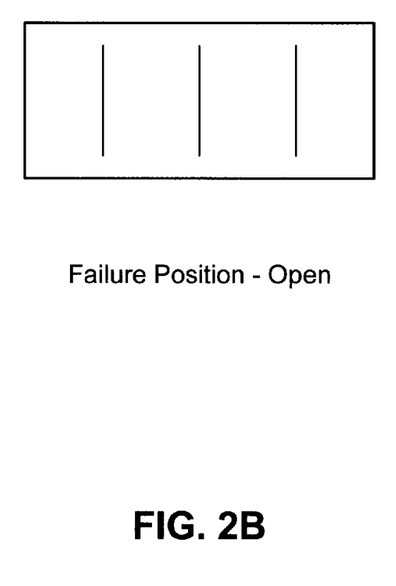
Figure 2C:
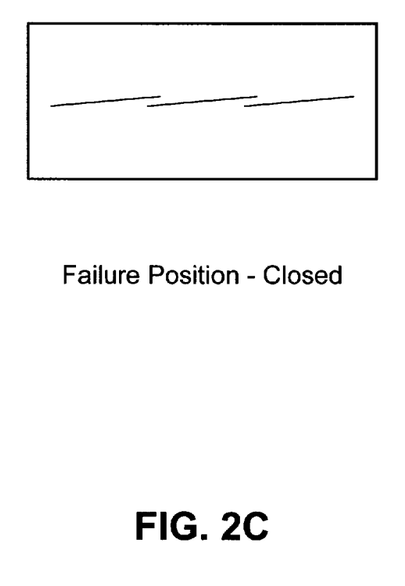

FIGS. 2A–C provide side or cross-sectional views of fan 102 corresponding to FIGS. 1A–C. Thus, FIG. 2A demonstrates the normal operating position of airfoils 104 when they are operating. FIG. 2B demonstrates the open failure position of airfoils 104 from FIG. 1B. FIG. 2C demonstrates the closed failure position of airfoils 104 from FIG. 1C.

In one embodiment of the invention, a blade or other airfoil includes a shaft for coupling the blade to its hub or spinner. The hub may comprise bores or holes for receiving each shaft. A blade shaft may be coupled directly to the hub, or some coupling mechanism may be employed to couple them.

In this embodiment, blades transition between their operating and failure positions via rotation. In particular, each blade shaft may be configured to rotate within its hub bore. A bias mechanism biases a blade toward its failure position, but centrifugal force may be used to overcome the biasing force and rotate the blade toward its operating position when the hub spins or spins at a sufficient rate. Alternatively, the blades may be forced into their operating positions electrically or mechanically.

In an embodiment of the invention, bias mechanisms may comprise springs, elastic material, or other flexible components. For example, a bias mechanism may comprise a coil or torsion spring, or an elastic material anchored within the hub and connected to the shaft. The mechanism biases a blade toward its failure position when the centrifugal force of the spinning apparatus stops or is insufficient to overcome the strength of the bias.

In one alternative embodiment of the invention, a blade shaft may be shaped to allow extension from a hub, or retraction into the hub, as the shaft rotates. For example, a blade shaft may include one or more projections from the side of the shaft, which correspond to channels, grooves or slots in the hub bore into which the shaft is received.

As centrifugal or other force is applied to the blade, it extends outward from the hub, with the corresponding projection(s) and channel(s) interacting to rotate the shaft. The extension of a blade may be limited with stops or by the length of the channel(s). When the fan fails or is turned off, the blades automatically retract or rotate into their failure positions under the force of their bias mechanisms.

In another alternative embodiment, blades may be weighted to promote transition to or from a failure position. Thus, particularly in an orientation in which gravity may be taken advantage of, a blade may be weighted to promote its transition into the desired failure position (i.e., open or closed). Such weighting may be distributed across the surface of a blade or concentrated at one or more edges. Illustratively, the top edge of a blade may be weighted to help it fall into a "closed" position, or the bottom edge may be weighted to help rotate it into an "open" position.

Figure 3A:
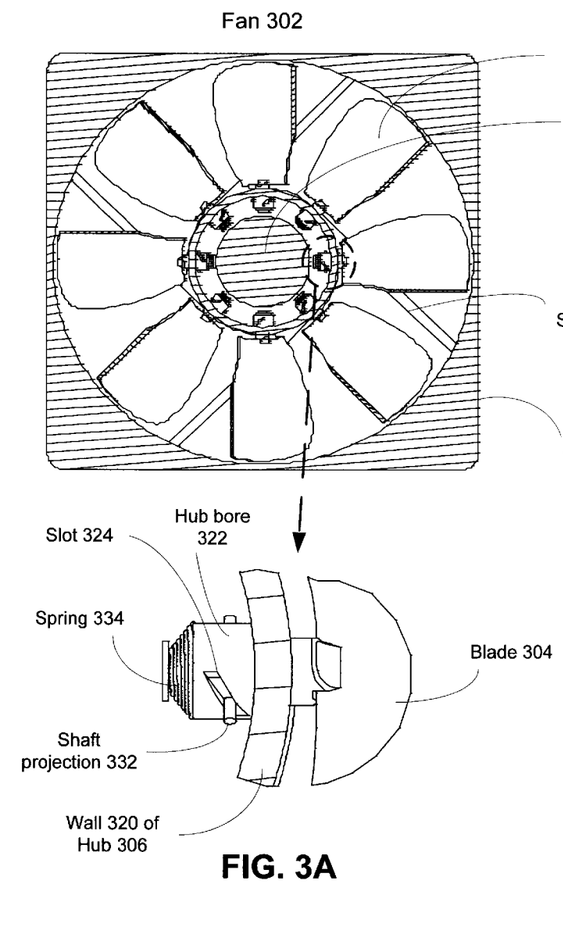
FIGS. 3A–B depict an apparatus configured for automatic failure of airfoils into an "open" position, with detail of a mechanism for promoting transition between an operating position and the failed position, in accordance with an embodiment of the present invention.
Figure 3B:
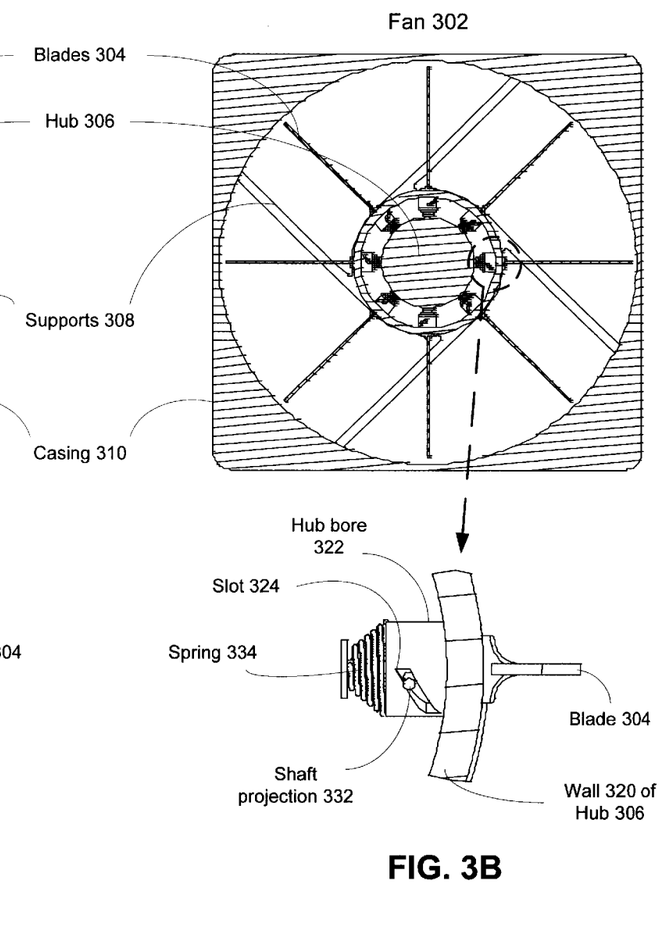

FIGS. 3A–B depict a mechanism or means for automatically transitioning an airfoil into a failed position, according to one embodiment of the invention. In this embodiment, the blade's failure position is an "open" position, in which the blade is oriented substantially parallel to the desired airflow.

FIG. 3A depicts fan 302 in a normal operating position, which includes blades 304, hub 306, supports 308 and casing 310. A bias mechanism is highlighted and detailed. The detailed view depicts a portion of blade 304, a portion of a wall 320 of hub 306, a hub bore or socket 322, slot 324 in bore 322, spring 334 and shaft projection 332. Shaft projection 332 extends perpendicular to the shaft of blade 304. The shaft is not visible in the detailed view.

In FIG. 3A, shaft projection 332 is positioned toward one end of slot 324, which cuts an oblique angle across bore 322. In this operating position, the surface of blade 304 is positioned at a suitable angle (e.g., between zero and ninety degrees) to the air channel through casing 310. Spring 334, which is coupled or attached to the shaft of blade 304, is in a compacted or compressed position. Spring 344 may be compressed when hub 306 spins fast enough for the centrifugal force applied to blade 304 to overcome the tension of the spring.

FIG. 3B depicts fan 302 in its open failed position. In the detailed view, blade 304 has transitioned to its open position, thereby presenting an edge of the blade to airflow through the channel of casing 310 and causing minimal impedance to the airflow. In this position, shaft projection 332 is now located toward the opposite end of slot 324 in bore 322.

FIG. 3B shows spring 334 in a relaxed or uncompressed state, in which it resists rotation of the shaft of blade 304. In different embodiments of the invention, spring 334 may be compressed or tensioned when blade 304 is transitioned from its failure position to its operating position, but its equilibrium state substantially corresponds to the failure position of blade 304, thereby biasing the blade toward that position.

Illustratively, the length of slot 324 may correspond to the degree of rotation needed to rotate blade 304 between its operating and failed positions. Thus, in FIGS. 3A–B, if blade 304 rotated approximately forty-five degrees, then slot 324 may extend approximately forty-five degrees about the circumference of bore 322.

In one alternative embodiment of the invention, slot 324 may be aligned substantially perpendicular to the axis of bore 322. In this alternative embodiment, blade 304 would not be extended from hub 306 when it rotates into its operating position from its failure position. Instead, as the hub spins faster, the force of air upon the open blade may overcome the bias of spring 334 and cause the blade to rotate into its operating position. When the hub slows sufficiently, the bias of spring 334 would cause the blade to rotate back into its failure position.

One of ordinary skill in the art would recognized from the preceding description how the embodiment of the invention depicted in FIGS. 3A–B could be modified for an apparatus in which the airfoils are to fail into a "closed" position.

FIGS. 4–7 demonstrate other means for biasing a blade or airfoil toward a failure position, according to alternative embodiments of the invention.

Figure 4:
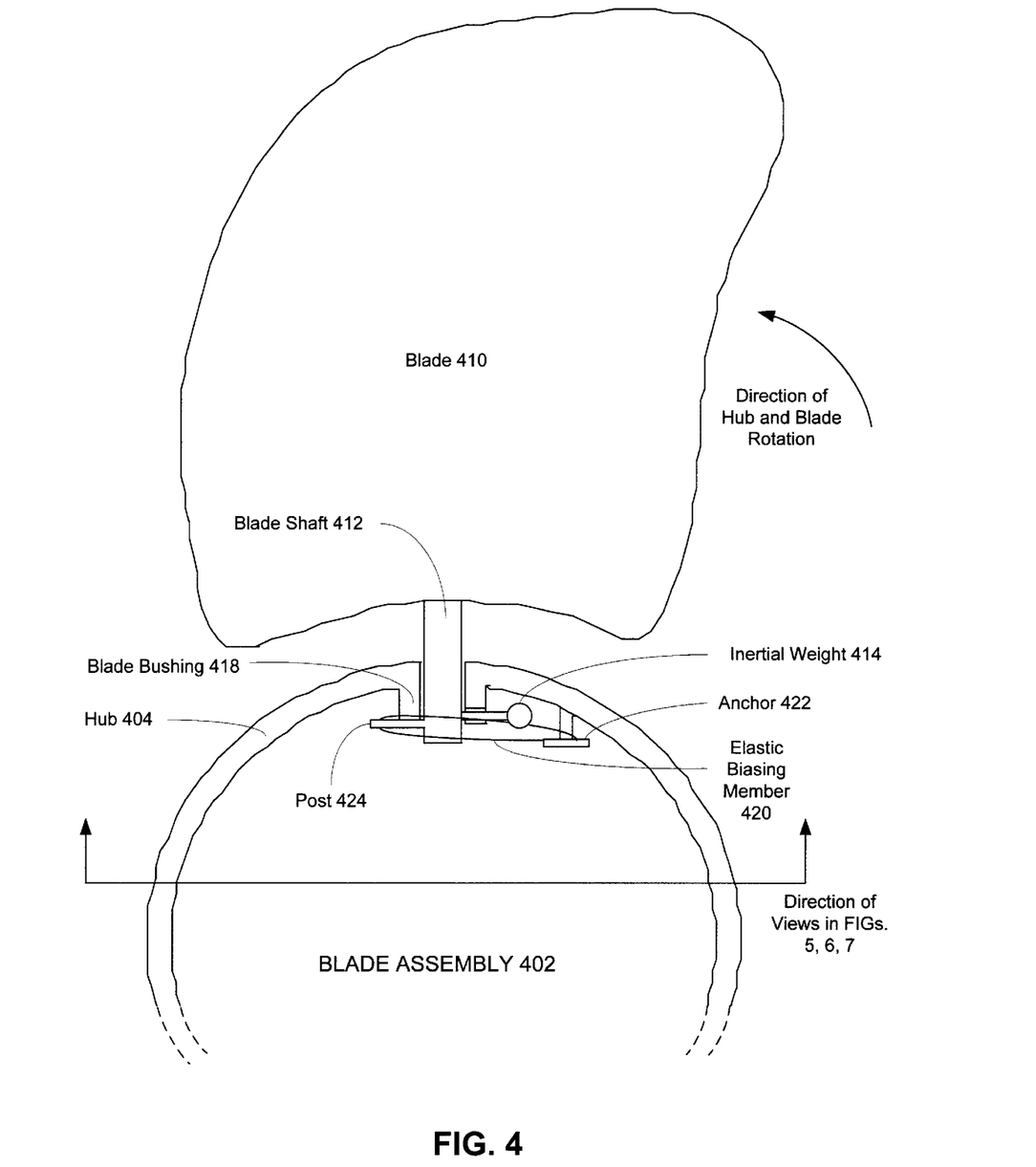
FIG. 4 is a block diagram of a blade assembly for biasing a fan blade toward a failure position, according to one embodiment of the invention.

In FIG. 4, blade 410 is coupled to hub 404 via blade shaft 412 and bushing 418. Elastic biasing member 420 biases the shaft toward rotating into the blade's failure position. Biasing member 420 is anchored by anchor 422 and is coupled to the blade via post 424. Inertial weight 414 is coupled to blade shaft 412. When blade 410 and hub 404 rotate about the hub axis (not shown) in the indicated direction, inertial weight 414 helps shaft 412 rotate into the blade's operating position. The direction of the views of FIGS. 5, 6 and 7 is shown in FIG. 4.

Figure 5A:
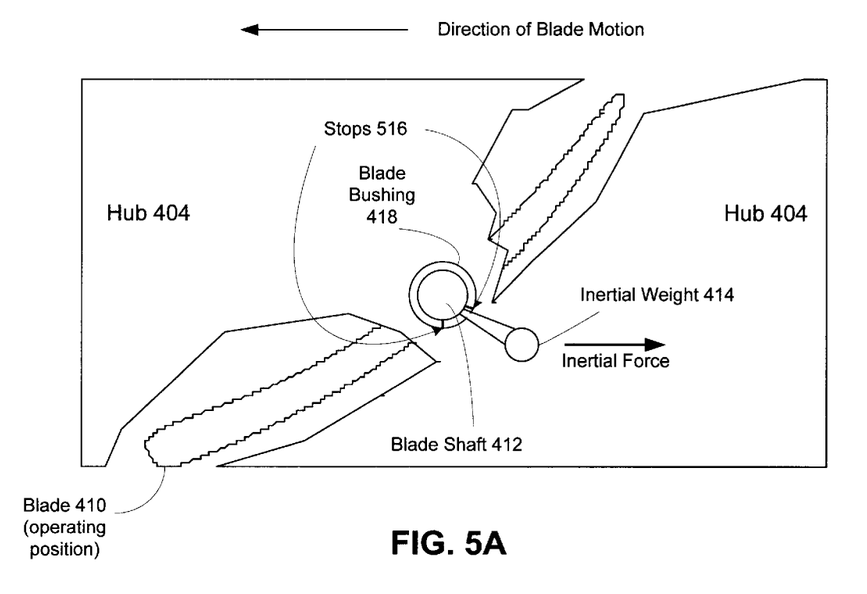
FIGS. 5A–B provide detailed views of an illustrative blade assembly for automatically biasing a fan blade toward a failure position, according to one embodiment of the invention.
Figure 5B:
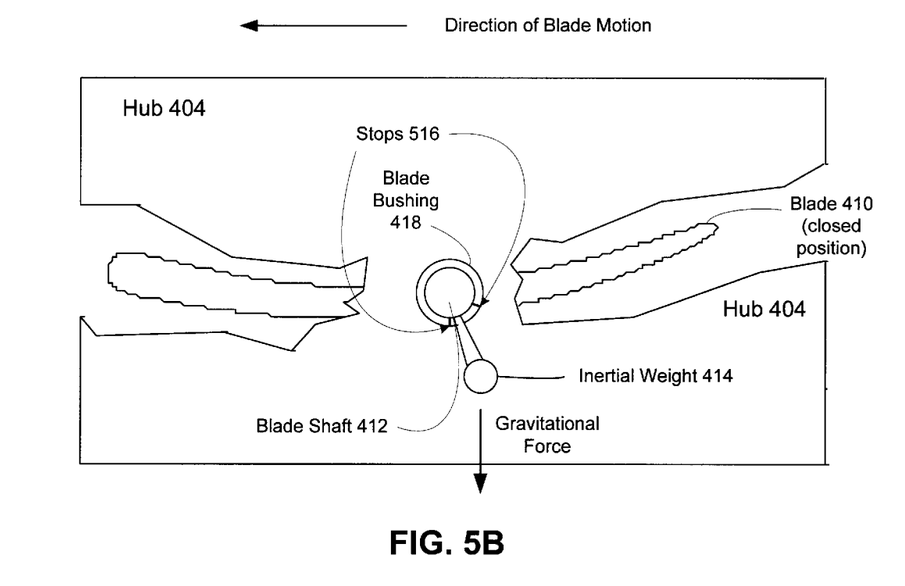

In FIG. 5A, blade 410 is shown in its operating position; FIG. 5B depicts blade 410 in its failure (closed) position. In the embodiment of the invention depicted in FIGS. 5A–B, no elastic biasing means is necessary; inertial weight 414 helps rotate blade shaft 412 into the operating position when the blade moves fast enough, and promotes rotation of the shaft into the failure position when the blade slows. More particularly, inertial force helps keep blade shaft 412 in the operating position in FIG. 5A, while gravitational force helps rotate the shaft into the failure position in FIG. 5B. Stops 516 limit the rotation of weight 414 and shaft 412.

Figure 6A:
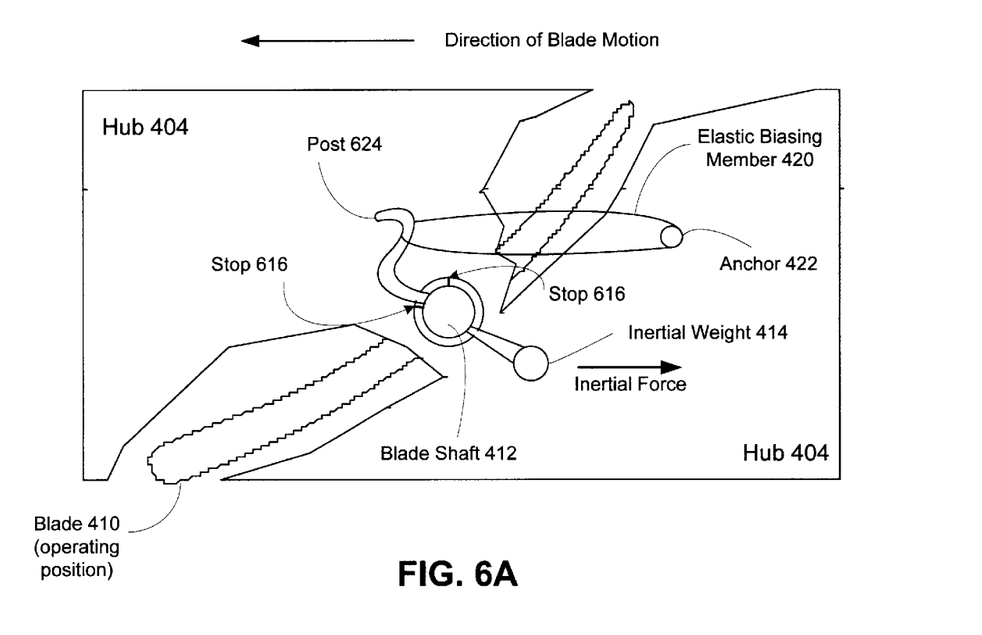
FIGS. 6A–B provide detailed views of one alternative blade assembly for automatically biasing a fan blade toward a failure position, according to one alternative embodiment of the invention.
Figure 6B:
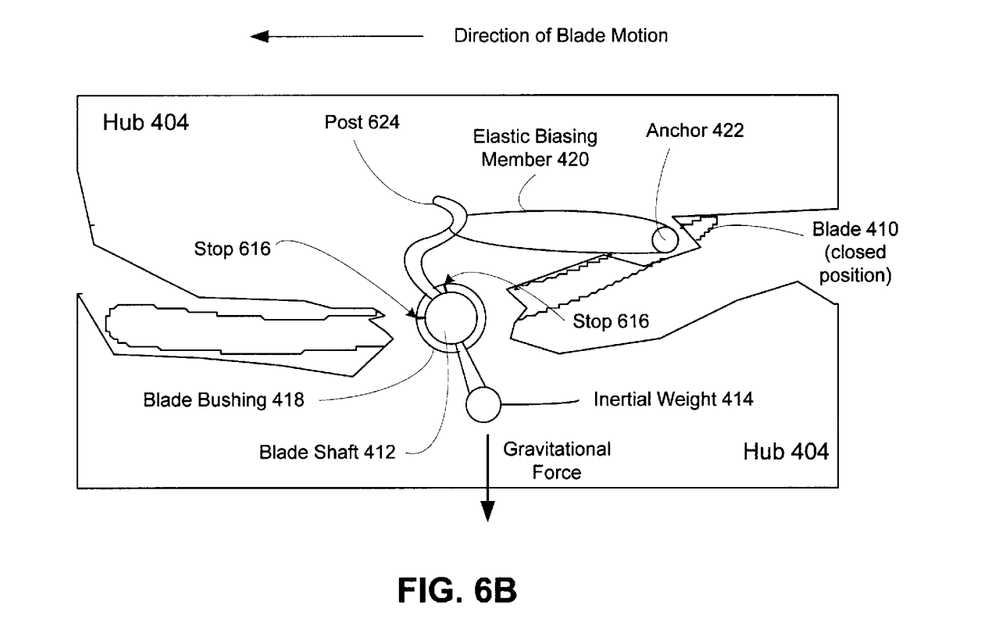

FIGS. 6A–B illustrate an embodiment of the invention in which inertial weight 414 is used with elastic biasing member 420. In FIG. 6A, blade 410 is shown in its operating position; FIG. 6B depicts blade 410 in its failure (closed) position. As in the embodiment of FIG. 4, the elastic biasing member stretches between anchor 422 and post or hook 624, and biases blade shaft 412 and blade 410 into the failure position. When the blade rotates fast enough about hub 404, the inertial force of inertial weight 414 overcomes the elastic biasing member. Stops 616 limit the rotation of blade shaft 412 and inertial weight 414.

Figure 7A:
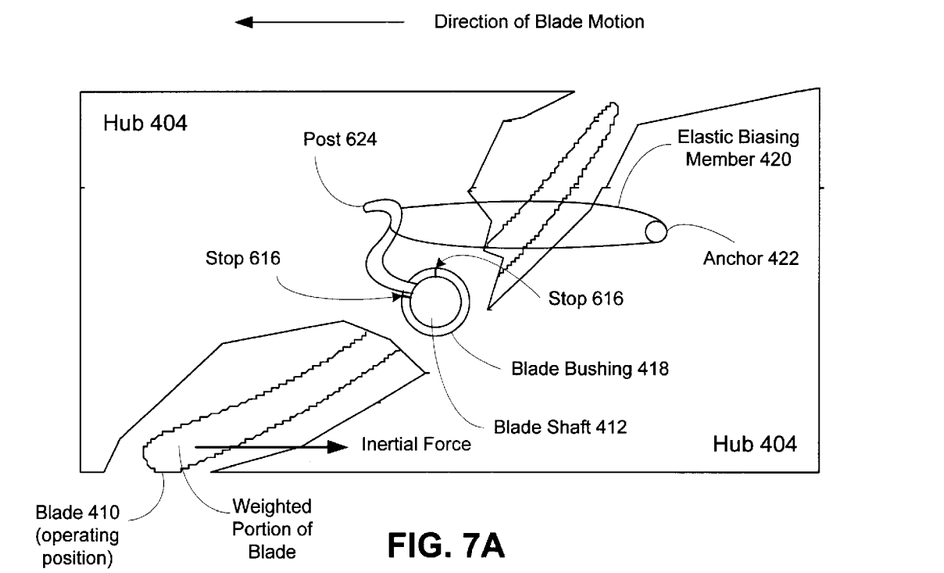
FIGS. 7A–B provide detailed views of another alternative blade assembly for automatically biasing a fan blade toward a failure position, according to another alternative embodiment of the invention.
Figure 7B:
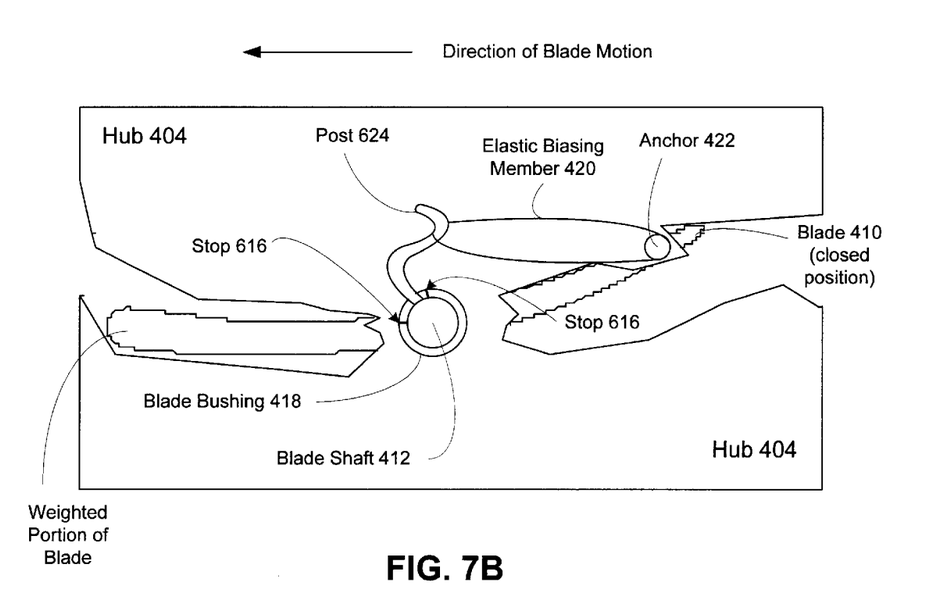

FIGS. 7A–B demonstrate an embodiment in which elastic biasing member 420 is employed with a weighted blade instead of an inertial weight. In FIG. 7A, blade 410 is shown in its operating position; FIG. 7B depicts blade 410 in its failure (closed) position. The elastic biasing member and the weighted portion of blade 410 biases the blade into the failure position. When the blade rotates fast enough about the axis of hub 404, the inertial force of the weighted blade overcomes the elastic biasing member. Stops 616 limit the rotation of blade shaft 412 and inertial weight 414.

The foregoing embodiments of the invention have been presented for purposes of illustration and description only. They are not intended to be exhaustive or to limit the invention to the forms disclosed. Accordingly, the scope of the invention is defined by the appended claims, not the preceding disclosure.

What is claimed is:

1. A fan having an automatic failure mode, comprising:
    a housing defining an air channel;
    within the air channel, a hub configured to spin about a hub axis;
    a first blade; and
    a first blade coupler configured to:
        couple the first blade to the hub;
        maintain the first blade in an operating position when the hub is spinning; and
        facilitate automatic positioning of the first blade in a failure position when the hub is not spinning.

2. The fan of claim 1, further comprising:
    one or more blades in addition to the first blade; and
    for each of the one or more blades, a blade coupler configured to couple the blade to the hub.

3. The fan of claim 1, wherein said first blade coupler comprises:
    bias means for biasing said first blade toward said failure position.

4. The fan of claim 1, wherein said first blade comprises:
    an airfoil configured to promote airflow through the air channel when said first blade is in said operating position when the hub is spinning.

5. The fan of claim 4, wherein said airfoil is weighted to promote transition of said first blade from said operating position to said failure position when the hub is not spinning.

6. The fan of claim 4, wherein said airfoil is configured to facilitate airflow through the air channel when said first blade is in said failure position.

7. The fan of claim 6, wherein a surface of said airfoil is substantially parallel to the hub axis when said first blade is in said failure position.

8. The fan of claim 4, wherein said airfoil is configured to impede airflow through the air channel in said failure position.

9. The fan of claim 8, wherein a surface of said airfoil is substantially perpendicular to the hub axis when said first blade is in said failure position.

10. The fan of claim 1, wherein said first blade coupler comprises a shaft of said first blade.

11. The fan of claim 10, wherein said shaft is rotatably coupled to the hub.

12. The fan of claim 10, wherein said first blade coupler further comprises a flexible biasing member.

13. The fan of claim 12, wherein said biasing member is coupled to said shaft and is configured to rotate said shaft of first blade toward said failure position.

14. The fan of claim 12, wherein said first blade coupler further comprises a weight configured to counteract said biasing member when the hub is spinning.

15. A fan, comprising:
    a plurality of airfoil means configured to force air through a channel when spinning in operating positions;
    spinner means for spinning said plurality of airfoil means in said operating positions; and
    bias means for biasing said plurality of airfoil means into failure positions impeding the flow of air through the channel, including a first biasing member configured to force a first airfoil toward said failure position when the spinner means is not spinning;
    wherein said first airfoil comprises a post configured to couple said first biasing member to said first airfoil.

16. The fan of claim 15, wherein said first airfoil further comprises a first weight configured to facilitate forcing of said first airfoil toward said operating position when the spinner spins.

17. The fan of claim 15, wherein said airfoils are forced toward said operating positions when the spinner spins.

18. A fan, comprising:
a plurality of airfoil means configured to force air through a channel when spinning in operating positions;
spinner means for spinning said plurality of airfoil means in said operating positions; and
bias means for biasing said plurality of airfoil means into failure positions facilitating the flow of air through the channel;
wherein said airfoil means are forced toward said operating positions when the spinner means spins said plurality of airfoil means.

19. The fan of claim 18, wherein said bias means includes a first biasing member configured to force a first airfoil means toward said failure position when the spinner means is not spinning said plurality of airfoil means.

20. The fan of claim 19, wherein said first airfoil means comprises a post configured to couple said first biasing member to said first airfoil means.

21. The fan of claim 19, wherein said first airfoil means comprises a first weight configured to force said first airfoil means toward said operating position when the spinner means spins said plurality of airfoil means.

22. A fan, comprising:
a casing defining a channel for airflow;
within the channel, a hub configured to spin;
a blade comprising:
a rotatable shaft configured to couple the blade to the hub; and
an airfoil having a variable orientation depending on the rotation of the shaft;
wherein the blade maintains a first rotational position while the hub is spinning, thereby maintaining the airfoil in a first orientation; and
wherein the blade rotates to a second rotational position when the hub stops spinning, thereby placing the airfoil in a second orientation;
biasing means for biasing rotation of the rotatable shaft of the blade toward said second rotational position; and
weight means configured to counteract said biasing means when the hub is spinning.

23. The fan of claim 22, wherein the rotatable shaft of the blade comprises one or more projections extending substantially perpendicular from the rotatable shaft.

24. The fan of claim 23, wherein:
the rotatable shaft of the blade is configured to be received by a bore in the hub;
said biasing means comprises one or more slots in the bore of the hub; and
said one or more projections are configured to engage the one or more slots in the bore of the hub.

25. The fan of claim 23, wherein:
said biasing means comprises an elastic biasing member; and
said one or more projections are configured to engage the elastic biasing member configured to rotate the blade to said second rotational position.

26. The fan of claim 22, wherein said biasing means comprises:
flexible means configured to promote rotation of the blade from said first rotational position toward said second rotational position.

27. The fan of claim 22, wherein said biasing means comprises:
a spring configured to promote rotation of the blade from said first rotational position toward said second rotational position.

28. The fan of claim 22, wherein in said second rotational position of the blade, the airfoil is configured to block airflow through the casing.

29. The fan of claim 22, wherein:
the hub is configured to spin about an axle; and
in said second rotational position of the blade, the airfoil is substantially perpendicular to the axle.

30. The fan of claim 22, wherein in said second rotational position of the blade, the airfoil is configured to facilitate airflow through the casing.

31. The fan of claim 22, wherein:
the hub is configured to spin about an axle; and
in said second rotational position of the blade, the airfoil is substantially parallel to the axle.

32. A fan, comprising:
a casing defining a channel for airflow;
within the channel, a hub configured to spin; and
a blade comprising:
a rotatable shaft configured to couple the blade to the hub; and
an airfoil having a variable orientation depending on the rotation of the shaft;
wherein the blade maintains a first rotational position while the hub is spinning, thereby maintaining the airfoil in a first orientation;
wherein the blade rotates to a second rotational position when the hub stops spinning, thereby placing the airfoil in a second orientation; and
wherein a portion of the airfoil is weighted to promote rotation of the blade from said first rotational position toward said second rotational position.

33. The fan of claim 32, wherein in said second rotational position of the blade, the airfoil is configured to block airflow through the casing.

34. The fan of claim 32, wherein in said second rotational position of the blade, the airfoil is configured to facilitate airflow through the casing.

35. A fan, comprising:
a casing defining a channel for airflow;
within the channel, a hub configured to spin; and
a blade comprising:
a rotatable shaft configured to couple the blade to the hub; and
an airfoil having a variable orientation depending on the rotation of the shaft;
wherein the blade maintains a first rotational position while the hub is spinning, thereby maintaining the airfoil in a first orientation, and rotates to a second rotational position when the hub stops spinning, thereby placing the airfoil in a second orientation; and
wherein in said second rotational position of the blade, the airfoil is configured to facilitate airflow through the casing.

36. The fan of claim 35, wherein:
the hub is configured to spin about an axle; and
in said second rotational position of the blade, the airfoil is substantially parallel to the axle.

37. The fan of claim 35, wherein the rotatable shaft of the blade is configured to be received by a bore in the hub.

38. The fan of claim 37, wherein the rotatable shaft of the blade comprises one or more projections extending substantially perpendicular from the rotatable shaft.

39. The fan of claim 38, wherein said one or more projections are configured to engage one or more corresponding slots in the bore of the hub.

40. The fan of claim 38, wherein said one or more projections are configured to engage an elastic biasing member configured to rotate the blade to said second rotational position.

41. The fan of claim 35, further comprising:

flexible means configured to promote rotation of the blade from said first rotational position toward said second rotational position.

42. The fan of claim 41, further comprising:

weight means configured to counteract said flexible means when the hub is spinning.

43. The fan of claim 35, further comprising:

a spring configured to promote rotation of the blade from said first rotational position toward said second rotational position.

44. The fan of claim 43, further comprising:

weight means configured to counteract said spring when the hub is spinning.

45. The fan of claim 35, further comprising:

biasing means for biasing rotation of the rotatable shaft of the blade toward said second rotational position.

46. The fan of claim 45, further comprising:

weight means configured to counteract said biasing means when the hub is spinning.

47. The fan of claim 35, wherein a portion of the airfoil is weighted to promote rotation of the blade from said first rotational position toward said second rotational position.

48. The fan of claim 35, wherein in said first rotational position of the blade, the airfoil is configured to create airflow through the casing as the hub spins.

49. The fan of claim 35, wherein the fan is aligned serially with one or more additional fans.

* * * * *